OSCILLATOR WITH CONTROLLED LINEAR FEEDBACK CIRCUIT

Filed Aug. 1, 1966 2 Sheets-Sheet 1

INVENTOR.
JOHN G. NORDAHL
BY
Arnold & Roylance
ATTORNEYS

INVENTOR.
JOHN G. NORDAHL
BY
Arnold & Roylance
ATTORNEYS

United States Patent Office 3,369,193

Patented Feb. 13, 1968

3,369,193

OSCILLATOR WITH CONTROLLED LINEAR FEEDBACK CIRCUIT

John G. Nordahl, Lexington, Mass., assignor to Weston Instruments, Inc., Newark, N.J., a corporation of Delaware Filed Aug. 1, 1966, Ser. No. 569,222
8 Claims. (Cl. 331—109)

ABSTRACT OF THE DISCLOSURE

An oscillator including an amplifier and a frequency determining circuit is provided with a feedback circuit having a variable impedance diode circuit to vary the magnitude of the feedback signal for control of the amplitude of the oscillations. A rectifier-integrator circuit develops a DC signal proportional to oscillation amplitude and a control circuit drives the diode circuit with a current proportional to the DC voltage thereby controlling the diode circuit impedance to ground.

This invention relates to oscillator systems having an amplifier and a feedback network connected between the input and output terminals of the amplifier, and more specifically to such an oscillator system wherein the gain of the feedback network is variable and is controlled by circuit means responsive to the amplitude of the signals appearing at the amplifier output to thereby closely control the amplitude of the system output signal.

In the oscillator art, it is well known to provide an amplifier with a positive feedback network which modifies the amplifier output signal in an appropriate way and connects that signal to the input terminal of the amplifier to sustain oscillations. Many such networks are known, including feedback networks having active as well as passive circuit elements.

The present invention includes a novel oscillator system using an active network which can be characterized as a linear modulator. An impedance is connected in the feedback network to attenuate the amplitude of the AC signal being fed back. The impedance is variable in magnitude and is controlled by a DC control voltage. The control voltage applied to the variable impedance is derived from the AC output signal itself, so that close control of the amplitude of the feedback signal, and therefore of the system output signal, is obtained.

More specifically, in order to control the net positive feedback gain of an oscillator, a small amount of AC current, derived from the oscillator output, is connected to a terminal which can be referred to as the resistance terminal of the linear modulator, and the resulting AC voltage drop across this controlled resistance is then applied to the input of the oscillator amplifier. This variable gain feedback path is placed in the oscillator circuit in such a manner as to vary the net positive feedback gain over a range of values from slightly less than unity to slightly greater than unity. If the net positive feedback gain is less than unity, the envelope of the oscillation tends to decay exponentially. If the net positive feedback gain is greater than unity, the envelope will exponentially increase. Only when a net positive feedback gain of precisely unity is achieved will the envelope be stable in amplitude. In accordance with the present invention, the net feedback gain is continually adjusted by the modulator circuit which is supplied by an amplitude control monitoring circuit, referred to herein as an AC-to-DC converter, which is driven by the output voltage and which provides the signal to the modulator control input terminal. If the system output signal becomes, for example, too small in amplitude, the modulator is momentarily readjusted to provide greater than unity positive feedback. The oscillation envelope is then increased until the proper amplitude is obtained, at which time the gain through the modulator returns to substantially unity value.

In the particular embodiment which will be disclosed in detail, the variable impedance itself is a series connected plurality of semiconductor diodes forming a voltage variable resistance. An operational amplifier circuit provides a control voltage which varies the effective resistance of the diode circuit. The control voltage is developed from a signal taken from the system output, and rectified and integrated to provide a DC voltage proportional to the amplitude of the output AC. The variable impedance and control circuit itself includes a plurality of asymmetrically conductive semiconductor devices connected in series circuit relationship between the output terminal of an operational amplifier and a point of reference potential, e.g., ground. The output terminal at which the variable resistance appears, i.e., the resistance terminal, and to which the oscillator feedback circuit is connected, is placed midway in that series circuit. The operational amplifier has a feedback circuit comprising a like plurality of semiconductor devices connected between the amplifier input and output terminals.

It should be noted that the linear modulator circuit to be described herein is not limited to use in oscillators, but is particularly useful therein and will therefore be described in this context.

An object of the present invention is to provide an oscillator system having variable impedance feedback circuit means for providing a controlled amplitude AC output signal.

Another object is to provide an oscillator system in which the feedback network includes a voltage variable impedance, the voltage control signal for which is a linear function of the amplitude of the AC oscillator output.

A further object is to provide a voltage variable impedance usable in an oscillator system wherein the impedance comprises a plurality of asymmetrically conductive circuit elements connected in a series circuit, the circuit being driven and controlled by a DC voltage from an operational amplifier having a feedback circuit also including a plurality of asymmetrically conductive circuit elements.

In order that the manner in which the foregoing and other objects are obtained in accordance with the invention can be understood in detail, particularly advantageous embodiments thereof will be described with reference to the accompanying drawings which form a part of this specification, and wherein.

Figures 1, 2:
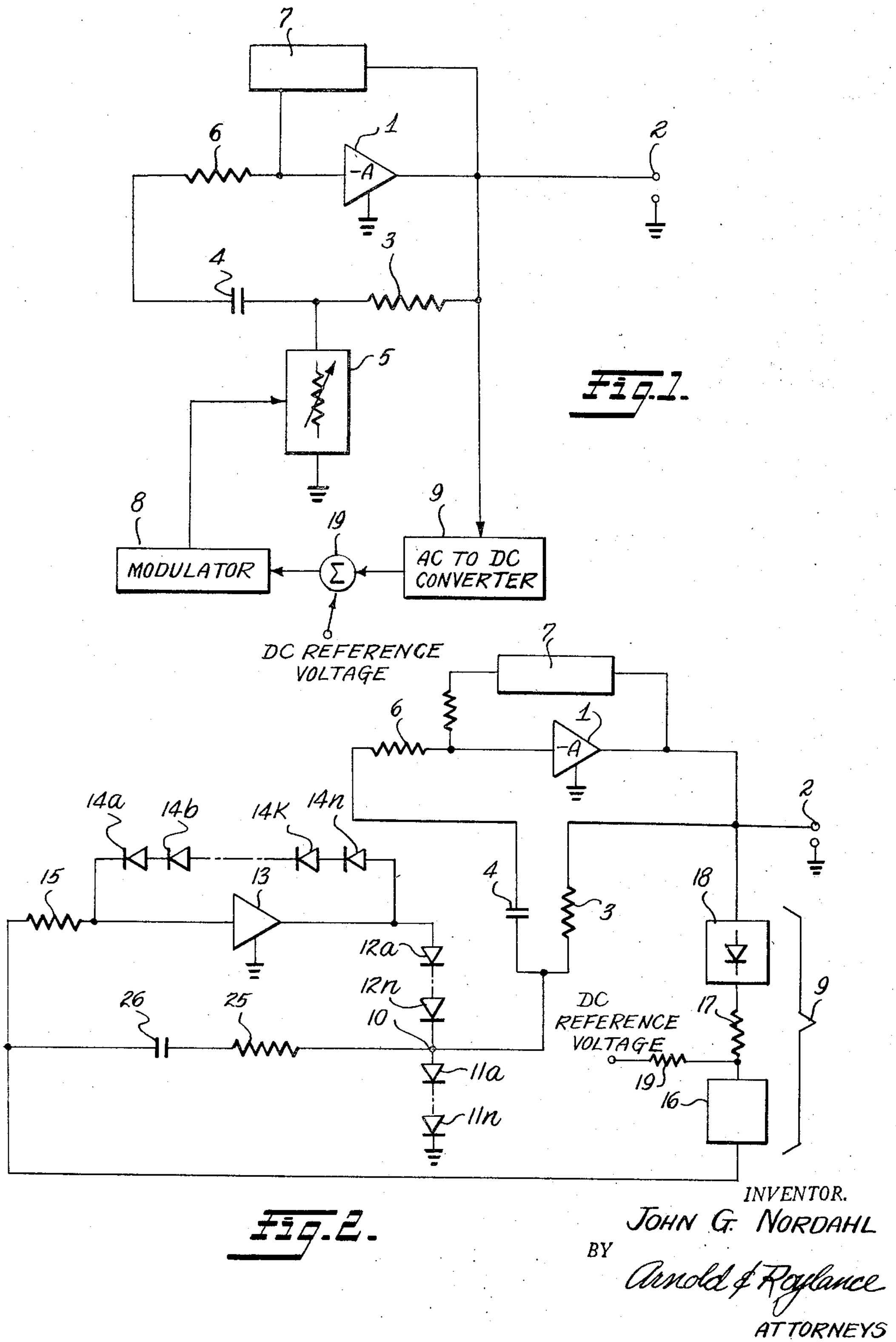
FIG. 1 is a schematic diagram, partially in block form, showing an oscillator system incorporating the present invention.
FIG. 2 is a schematic diagram, partially in block form, showing a system of the type of FIG. 1 in greater detail.

In FIG. 1, an amplifier 1 has an output terminal which is connected to a network output terminal 2 at which the ultimate output signals from the system appear. The output terminal of amplifier 1 is also connected to a feedback network including a resistor 3 and a capacitor 4, connected in series, and a variable impedance indicated generally at 5. Also in series with the resistor and capacitor is an input resistor 6 which is connected to the input terminal of amplifier 1. A frequency determining network 7 is shown in FIG. 1 as being connected in parallel with the amplifier. It will be understood by those skilled in the art that it is necessary for any oscillator to have some frequency determining network if it is desired that the system produce oscillations at some preselected frequency. Any conventional network will suffice, assuming accuracy and stability, existence of such a network being indicated at 7.

The operation and details of the variable impedance 5 will be described in greater detail below. For purposes of a preliminary discussion, element 5 can be considered to be any controllably variable impedance, and is shown being controlled by the output of a modulator circuit 8, the details of which will also be discussed hereafter. Modulator circuit 8 is driven from the output of a summing device 19 which compares the output of the AC-to-DC converter circuit with a reference voltage, and generates a voltage proportional to the algebraic sum. The AC-to-DC converter circuit 9 receives its input via a conductor connected to the output terminal of amplifier 1. The function of converter circuit 9 is to produce and deliver to modulator circuit 8 a DC voltage proportional to the amplitude of the AC voltage appearing at the oscillator output. The modulator circuit then produces a voltage which is suitable for control of impedance 5. Modulator circuit 8 is designed to produce a voltage which will decrease the impedance 5 when the voltage supplied to converter 9 increases, thereby diminishing the magnitude of the signal fed back to the input terminal of amplifier 1 to a level below unity. Likewise, when the output of amplifier 1 decreases, the output at modulator circuit 8 is such that the impedance of element 5 increases, thereby increasing the amplitude of the signal into amplifier 1 to greater than unity and returning the amplitude of the output signal to the desired level. Thus, with this system, a closely controlled amplitude oscillation is provided at output terminal 2.

In FIG. 2, a system for providing a controlled amplitude oscillation is shown in more detail. In FIG. 2, elements 1 through 7 retain the same reference numerals as in FIG. 1, and perform the same function. It will be seen that the junction between resistor 3 and capacitor 4 is connected to a junction 10 in the center of a series connection of a plurality of diodes. One group of diodes **11*a*–11*n* is connected between junction 10 and a point of reference potential, shown in FIG. 2 as ground. Diodes 11*a*–11*n* are all connected with their cathodes toward ground. A second group of diodes 12*a*–12*n* is connected in series circuit relationship between junction 10 and the output terminal of an operational amplifier 13. Diodes 12*a*–12*n* are connected with their cathodes toward junction 10. The diodes in these two groups constitute the variable impedance shown as element 5 in FIG. 1. In order that these diodes can operate as the variable impedance, and so that they can be controlled, a driving voltage is generated by amplifier 13 and controlled by a feedback network associated with amplifier 13**.

The feedback network includes a plurality of diodes **14*a*–14*n* connected in series circuit relationship between the input and output terminals of amplifier 13. One end of a resistance 15 is also connected to the input terminal of amplifier 13. The other end of resistance 15 is connected to one terminal of a filter or integrator circuit 16, the input terminal of which is connected to a summing device 19. This in turn is connected via a resistor 17 to the output terminal of rectifier circuit 18. The input terminal of rectifier circuit 18 is connected to the output terminal of amplifier 1**.

Circuits 16–18 of FIG. 2 are analogous to the AC-to-DC converter circuit 9 of FIG. 1. Rectifier circuit 18 provides a pulsating DC voltage having a predetermined amplitude relationship to the AC output of amplifier 1.

Figure 4:
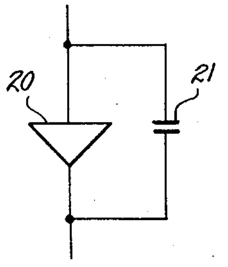
FIGS. 4 and 5 are schematic diagrams of circuits usable in the systems shown in FIGS. 1 and 2.
Figure 5:
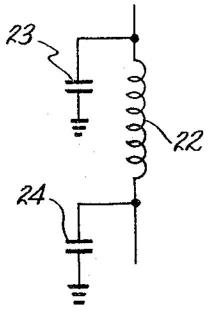

Resistor 17 couples this output to a summing device which compares it with a reference voltage. The resulting voltage, in turn, is fed to circuit 16 which produces from that pulsating voltage a smooth DC voltage bearing a predetermined amplitude relationship to the original AC signal. Circuit 16 can take the form of the circuit shown in FIG. 4 or FIG. 5. In FIG. 4, circuit 16 is shown to include an operational amplifier 20 and a capacitor 21 connected in parallel with the amplifier to form a well known integrator circuit. The circuit of FIG. 5 includes an inductance 22 and capacitors 23 and 24 to form a well known filter circuit arrangement. The circuit of FIG. 5, as will be recognized by one skilled in the art, is merely symbolic of the type of filter circuit which can be employed to accomplish the desired result when placed in the circuit as element 16. Note that if the frequency determining network 7 is made so that the frequency of the system can be changed over wide ranges, it is important for good system operation that circuit elements 16, 17 and 18 be selected so that they will function equally well throughout this frequency range. Under these circumstances, it would normally be more advantageous to employ the integrator circuit of FIG. 4 as element 16.

A circuit which performs especially well as AC-to-DC converter 9, replacing both of circuits 16 and 18, is fully described in a copending U.S. patent application Serial No. 267,206 in the name of Peter L. Richman, filed March 22, 1963, and assigned to the same assignee as the present application.

The DC output of circuit 16 is connected via resistor 15 to amplifier 13 and becomes the control voltage to vary the effective impedance of the diodes **11*a*–11*n* and 12*a*–12*n***.

The operation of the circuit shown in FIG. 2 will now be described. A DC voltage appearing at the output of circuit 16 causes a current to flow through input resistor 15. The operational amplifier 13, being a relatively high gain amplifier, responds by producing a voltage at its output terminal such that a current flows through the feedback circuit including diodes **14*a*–14*n* which is substantially equal to the current flowing through resistor 15. The potential at the input terminal of amplifier 13**, which is essentially a summing junction, is substantially zero.

It will be seen that the potential at the output terminal of amplifier 13, being sufficient to create the desired current flow through the feedback diode circuit, will also produce a current through the series circuit including diodes **12*a*–12*n* and 11*a*–11*n*, and that this current will be equal to that flowing through the feedback circuit, so long as the total number of diodes 11*a*–11*n* plus 12*a*–12*n*** is equal to the number of diodes in the feedback circuit. This is true because the cathode ends of both diode circuits rest substantially at zero potential.

From this, it will be recognized that the current flowing through each of the diode circuits is equal to the current flowing through resistor 15, which is directly proportional to the potential applied by circuit 16. As was described above, the DC voltage from circuit 16 is directly proportional to the amplitude of the AC signal appearing at the output terminal of amplifier 1. Thus, it follows that the current through the diode circuit including diodes **11*a*–11*n*, and thus through junction 10, is directly proportional to the amplitude of the AC signal appearing at the output terminal of amplifier 1. The effective impedance between junction 10** and ground is therefore varied in inverse proportion to that current in accordance with the well known feature of diode behavior that the incremental resistance of a single diode is inversely proportional to the current flowing through that diode.

With an increase in amplitude in the AC signal, and a similar increase in current through the circuit including junction 10, the effective impedance between junction 10 and ground is reduced and the positive feedback signal provided to the input of amplifier 1 is similarly reduced. Thus, the output of amplifier 1 is reduced in accordance with prior increase, and is stabilized at a point determined by the gain of the amplifier and the numbers of diodes chosen for the circuits associated with amplifier 13. It will be recognized that any number of diodes can be used in these circuits so long as the aforementioned condition of equality is maintained between the number of diodes in the impedance series circuit and the number of diodes in the feedback circuit of amplifier 13.

As yet, no mention has been made of the function of capacitor 4, which is connected in series with coupling resistor 3. From the above discussion, it will be apparent that junction 10 operates at some DC potential above ground. To isolate that voltage from the input to amplifier 1, capacitor 4 is included as a blocking capacitor.

In addition to the circuit elements previously described, a series circuit including a resistor 25 and a capacitor 26 is connected between junction 10 and the input side of resistor 15. This series circuit comprises a refinement to the above-described circuit to compensate for small amounts of high frequency ripple which might remain in the output of circuit 16. It will be apparent that if such ripple exists, it will be amplified in amplifier 13 and will still exist at junction 10. To eliminate this ripple, a compensating signal path including capacitor 26 and resistor 25 is connected from the output of circuit 16 to the junction. Capacitor 26 acts to block the DC level at the output of circuit 16, but to allow the ripple voltage to pass to junction 10. Because of the inversion existing in the amplifier and diode circuits, this ripple voltage will appear at junction 10 180° out of phase with the undesired ripple voltage, and will effectively cancel that ripple voltage.

Figure 3:
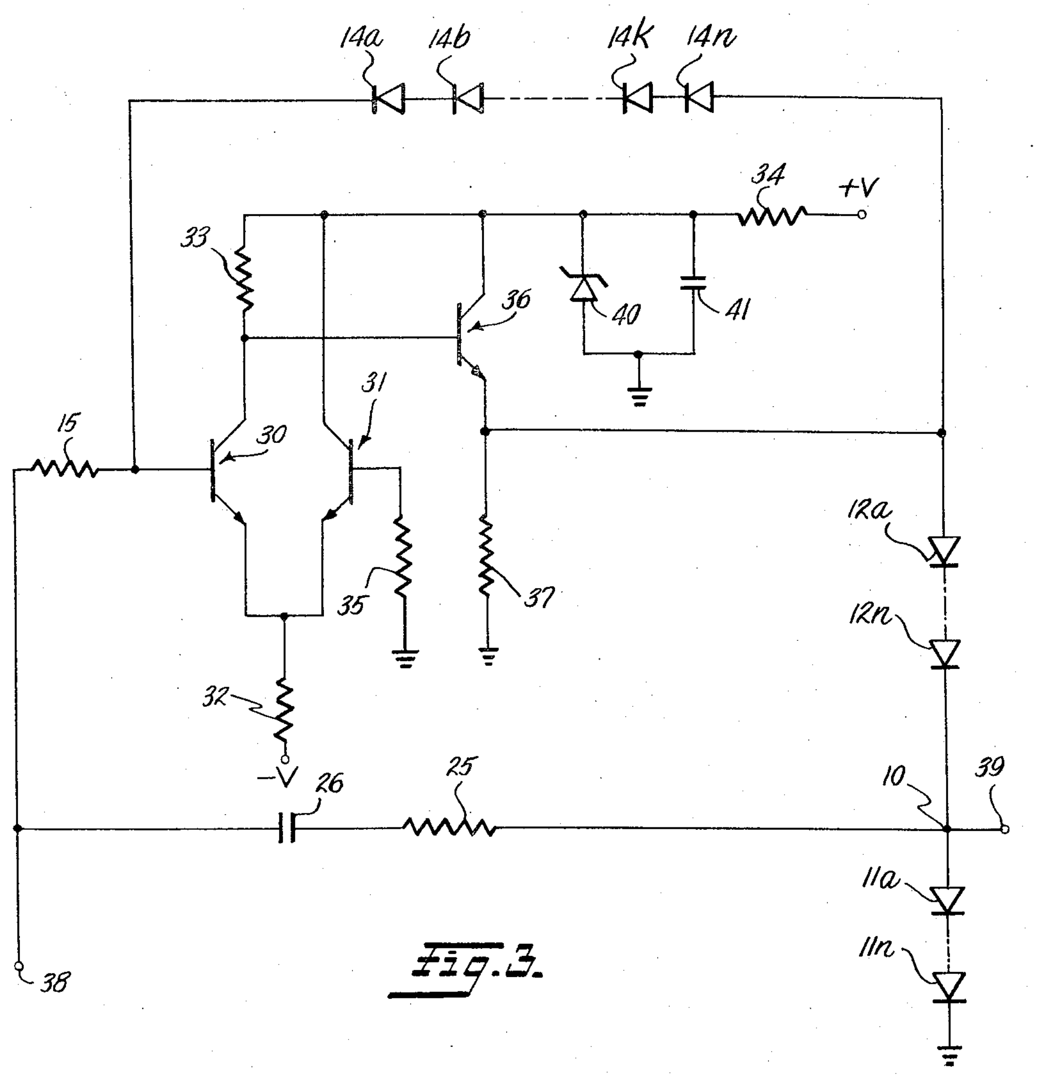
FIG. 3 is a schematic diagram of the variable impedance and control circuit of the type usable in the system of FIG. 2.

In FIG. 3 a more complete schematic diagram of the amplifier circuit is shown. Diodes **12*a*–12*n*, 11*a*–11*n* and 14*a*–14*n* are numbered as before. Likewise, capacitor 26, resistor 25, resistor 15, and junction 10** are identified as in FIG. 2.

The amplifier itself includes an NPN transistor indicated generally at 30 and an NPN transistor indicated generally at 31, these transistors being connected in a well known long-tailed pair circuit, also known as a common emitter pair circuit, their emitter electrodes being connected directly together and, via a biasing resistor 32, to a source of negative DC voltage. The collector electrode of transistor 30 is connected to one terminal of a voltage developing resistor 33, the other terminal of which is connected, via a resistor 34, to a source of positive DC voltage. The collector electrode of transistor 31 is connected via resistor 34 to the positive DC source. The base electrode of transistor 30 is connected to input resistor 15, and also to the cathode end of the series feedback circuit including diodes **14*a*–14*n*. The base electrode of transistor 31 is connected to one end of a biasing resistor 35**, the other end of which is connected to ground.

The collector electrode of transistor 30 is also connected to the base electrode of an NPN transistor indicated generally at 36, the collector electrode of which is connected through resistor 34 to the positive source, and the emitter electrode of which is connected via a biasing resistor 37 to ground. Transistor 36 is used as an emitter follower, the emitter electrode being connected to the anode end of the series diode feedback circuit, and also to the anode end of the diode impedance circuit including diodes **12*a*–12*n* and 11*a*–11*n*. As shown in FIG. 3, the input signal would be applied to a terminal 38 which is connected to resistor 15, and the output of the circuit appears at a terminal 39 which is connected to junction 10**.

Also shown in FIG. 3 is a voltage regulating circuit including a Zener diode 40, the cathode of which is connected to the positive DC line at resistor 34 and the anode of which is connected to ground. A filter capacitor 41 is connected in parallel with diode 40. As will be recognized by one skilled in the art, the Zener diode-capacitor circuit is unnecessary if the positive DC source, indicated at +V, is a closely regulated DC supply.

The operation of the amplifier portion of the circuit of FIG. 3 is conventional in nature and need not be described in detail. Transistors 30 and 31 act to produce a moderately high gain voltage output, the amplified signal being connected to transistor 36 which provides a relatively low impedance output to the diode circuits. The operation of the diode circuits themselves have been described with reference to FIG. 2.

While certain advantageous embodiments have been chosen to illustrate the invention, it will be understood by those skilled in the art that various changes and modifications can be made therein without departing from the scope of the invention as defined in the appended claims.

What is claimed is:

1. An oscillator system comprising the combination of
an amplifier having an input terminal and an output terminal;
feedback circuit means connected between said output terminal and said input terminal for providing a positive feedback signal to said input terminal, said feedback circuit means comprising
frequency determining circuit means connected between said input and output terminals of said amplifier for providing zero loop phase shift at the oscillator operating frequency;
first circuit means connected in parallel circuit relationship with said frequency determining circuit means for providing an amplitude controlled feedback signal to said amplifier input terminal;
controlled variable impedance circuit means connected between said first circuit means and a point of reference potential,
said controlled variable impedance circuit means comprising
a first plurality of asymmetrically conductive devices connected in series circuit relationship between said first circuit means and a point of reference potential, and
a second plurality of asymmetrically conductive devices connected in series circuit relationship, one end of said series circuit being connected to said first circuit means; and
control circuit means connected to said variable impedance circuit means for producing a DC control voltage to vary the impedance of said varable impedance circuit means,
said control circuit means comprising
an operational amplifier having an input terminal and an output terminal,
said output terminal of said operational amplifier being connected to the other end of said series circuit including said second plurality of asymmetrically conductive devices, and
a feedback circuit comprising a third plurality of asymmetrically conductive devices,
said feedback circuit being connected between said input and output terminals of said operational amplifier; and
second circuit means connected between said amplifier output terminal and said control circuit means for producing a DC voltage proportional to the AC voltage at said output terminal and for providing said voltage to said control circuit means,
said input terminal of said operational amplifier being connected to said second circuit means.

2. An oscillator system in accordance with claim 1 wherein
said second circuit means comprises
rectifier circuit means having an input terminal connected to said amplifier output terminal, and an output terminal; and
integrator circuit means connected between said output terminal of said rectifier circuit means and said input terminal of said operational amplifier for providing a DC voltage proportional to the signal at said amplifier output terminal.

3. An oscillator system in accordance with claim 1 wherein said second circuit means comprises rectifier circuit means having an input terminal connected to said amplifier output terminal, and an output terminal; and a filter circuit connected between said output terminal of said rectifier circuit means and said control circuit means.

4. An electrical network for providing a voltage-controlled variable resistance comprising the combination of a network output terminal at which a variable resistance appears with respect to a point of reference potential;

a plurality of asymmetrically conductive semiconductor devices connected in series circuit relationship to form a first series circuit, one end of said first series circuit being connected to said output terminal;

a plurality of asymmetrically conductive semiconductor devices connected in series circuit relationship to form a second series circuit, one end of said second series circuit being connected to said output terminal, the other end of said second series circuit being connected to a point of reference potential;

an input terminal to which a control voltage can be applied; and amplifier circuit means connected between said input terminal and the other end of said first series circuit for providing a driving current to said first series circuit proportional to said control voltage, said semiconductor devices of said first and second series circuits being oppositely poled relative to said output terminal.

5. An electrical network according to claim 4 and further comprising a plurality of asymmetrically conductive devices connected in series circuit relationship to form a feedback circuit, said feedback circuit being connected in parallel circuit relationship with said amplifier circuit means.

6. An electrical network in accordance with claim 4 wherein said amplifier circuit means comprises first and second transistors having their emitter electrodes connected to each other and to a point of reference potential forming a common emitter pair circuit, the base electrode of one of said first and second transistors being connected to said input terminal; and a third transistor having its base electrode connected to the collector electrode of said one of said first and second transistors, the emitter electrode of said third transistor being connected to said first series circuit.

7. An electrical network in accordance with claim 5 wherein said amplifier circuit means comprises first and second transistors having their emitter electrodes connected to each other and to a point of reference potential forming a common emitter pair circuit, the base electrode of one of said first and second transistors being connected to said input terminal and to one end of said feedback circuit; and a third transistor having its base electrode connected to the collector electrode of said one of said first and second transistors, the emitter electrode of said third transistor being connected to said first series circuit and to the other end of said feedback circuit.

8. An oscillator apparatus comprising the combination of an amplifier having an input terminal and an output terminal;

a frequency determining circuit connected between said input and output terminals of said amplifier;

an input resistor having a first terminal connected to said input terminal of said amplifier and a second terminal;

a feedback circuit connected between said output terminal of said amplifier and said second terminal of said input resistor;

controlled variable impedance circuit means connected between said feedback circuit and a point of reference potential;

control circuit means including an operational amplifier connected to said variable impedance circuit means for producing a DC control current to vary the impedance of said variable impedance circuit means; and converter circuit means connected between said amplifier output terminal and said control circuit means for producing a DC voltage proportional to the AC voltage at said output terminal and for providing said voltage to said control circuit means, said converter circuit means comprising rectifier circuit means having an input terminal connected to said amplifier output terminal, and an output terminal; and an integrator circuit including a high gain amplifier having input and output terminals, a feedback capacitor connected between said input and output terminals, and an input resistor connected between the input terminal of said high gain amplifier and said output terminal of said rectifier circuit means.

References Cited

UNITED STATES PATENTS

| | | | |
|---|---|---|---|
| 2,843,746 | 7/1958 | Hofker | 331—183 |
| 3,202,902 | 8/1965 | Glass | 331—109 |
| 3,254,304 | 5/1966 | Barret | 330—24 |

FOREIGN PATENTS

| | | |
|---|---|---|
| 644,083 | 10/1950 | Great Britain. |

JOHN KOMINSKI, *Primary Examiner.*

Disclaimer and Dedication 3,369,193.—*John G. Nordahl*, Lexington, Mass. OSCILLATOR WITH CONTROLLED LINEAR FEEDBACK CIRCUIT. Patent dated Feb. 13, 1968. Disclaimer and dedication filed Mar. 17, 1971, by the assignee, *Weston Instruments, Inc.*

Hereby enters this disclaimer to the remaining term of said patent and dedicates said patent to the Public.

[*Official Gazette April 27, 1971.*]